United States Patent
Landau et al.

[11] Patent Number: 6,120,601
[45] Date of Patent: Sep. 19, 2000

[54] WAFER ORIENTATION INSPECTION SYSTEM

[75] Inventors: Richard F. Landau; Edward D. Schultheis, both of Mountain View, Calif.

[73] Assignee: Varian Semiconductor Equipment Associates, Inc., Gloucester, Mass.

[21] Appl. No.: 08/728,420

[22] Filed: Oct. 10, 1996

Related U.S. Application Data

[63] Continuation of application No. 08/475,234, Jun. 7, 1995, abandoned.

[51] Int. Cl.⁷ .................................................. C30B 31/12
[52] U.S. Cl. ............................ 117/98; 117/200; 117/201; 117/900
[58] Field of Search ...................... 117/200, 201, 117/900, 98; 118/719; 414/936

[56] References Cited

U.S. PATENT DOCUMENTS

| | | | |
|---|---|---|---|
| 4,644,172 | 5/1987 | Sandland et al. | 250/548 |
| 4,819,167 | 4/1989 | Cheng et al. | 364/167.01 |
| 4,833,790 | 5/1989 | Spencer et al. | 33/520 |
| 5,102,280 | 4/1992 | Poduje et al. | 414/225 |
| 5,248,886 | 9/1993 | Asakawa et al. | 250/442.11 |
| 5,281,320 | 1/1994 | Turner et al. | 204/298.15 |
| 5,340,261 | 8/1994 | Osawa et al. | 414/217 |
| 5,483,138 | 1/1996 | Smookler et al. | 318/568.16 |
| 5,511,005 | 4/1996 | Abbe et al. | 364/552 |

FOREIGN PATENT DOCUMENTS

| | | | |
|---|---|---|---|
| 0288233 | 10/1988 | European Pat. Off. | |
| 64-30242 | 2/1989 | Japan | H01L 21/68 |
| 64-57104 | 3/1989 | Japan | G01B 11/00 |
| 1-108740 | 4/1989 | Japan | H01L 21/68 |
| WO 95/00819 | 1/1995 | WIPO | G11B 11/00 |

*Primary Examiner*—Felisa Hiteshew
*Attorney, Agent, or Firm*—Wolf, Greenfield & Sacks, P.C.

[57] ABSTRACT

An apparatus and method for precisely calibrating the transfer arm of a multiple station wafer processing system without breaking vacuum and with a minimum of system downtime is provided. A system of determining and properly aligning the crystallographic orientation of the wafers before processing as well as monitoring the orientation of individual wafers during wafer transfer between processing stations is also provided.

25 Claims, 4 Drawing Sheets

WAFER ORIENTATION INSPECTION SYSTEM

This application is a continuation, of application Ser. No. 08/475,234 filed Jun. 7, 1995, now abandoned.

The present invention relates generally to wafer handling systems, and more particularly to a system of calibrating a wafer transfer arm and monitoring the orientation of wafers throughout their transfer between areas within a wafer processing system.

BACKGROUND OF THE INVENTION

Multiple station wafer processing systems are an integral part of the manufacture of integrated circuits and other wafer based products. These systems typically have multiple coating stations which allow a variety of materials to be deposited on the wafer surface. Patterning and etching stations may be interspersed between the coating stations.

A single system with multiple processing stations offers a number of benefits over the use of separate processing systems for each stage of production. First, wafer fabrication in a multiple station system is much faster than that obtainable using individual processing systems since the wafers need not be pretreated between each station and the overall system can be easily automated. Second, a superior product can be fabricated using such a system since the wafers do not become contaminated between production steps. Contamination results not just from airborne contaminants, but also from such sources as water vapor. Therefore it is critical to keep the wafers in an evacuated environment throughout as much of the process as possible. In a multiple station system even during wafer transfer the wafers are never exposed to pressures greater than approximately $5 \times 10^{-8}$ Torr.

Multiple station wafer handling systems typically use robotic transfer arms to move wafers from station to station. These transfer arms must be calibrated so that they place the wafers in the correct position within each processing station. If a wafer is not properly placed within a station it may be improperly treated, thus leading to a defective part. Furthermore, this defect may not be readily apparent and thus substantial and costly processing and testing may be completed before the defect is even identified. To further exacerbate the problem, once the transfer arm is out of calibration tens or hundreds of wafers may be processed before the defect is even noticed thus leading to even greater financial loss.

Once it is determined that the transfer arm must be calibrated, the entire handling system must be brought up to atmospheric pressure and the system taken apart to a sufficient degree to enable a technician to calibrate the arm. The arm is calibrated by moving it to each processing station and visually inspecting its location. Based upon this visual inspection, the arm is adjusted and the inspection process is repeated. This procedure continues until the system user is satisfied with the arm's calibration, at which time the system is reassembled and evacuated. Assuming that only minor transfer arm adjustment and calibration are required, this procedure typically requires approximately 16–20 hours. Furthermore the final calibration is not very accurate since it is based solely on a visual review of the placement of the transfer arm within each processing station.

Wafers are often selected for processing on the basis of their crystallographic orientation. This orientation is typically noted on each individual wafer through the placement of a notch or a flat along the wafer's circumference. Therefore it is often important that the wafer handling system have some means of identifying the orientation of each wafer as well as maintaining the proper alignment of the wafers throughout processing.

Presently wafer orientation is determined using a costly laser system. The laser scans each wafer to determine its orientation, and then the wafer is rotated to achieve the desired alignment of the wafer's orientation with respect to the processing system. Once the wafer's orientation is properly aligned, the user must simply assume that the wafer does not become misaligned during subsequent handling and processing. A wafer which becomes misaligned during processing may not meet the required operational specifications, thus leading to its rejection.

From the foregoing, it is apparent that a method of calibrating the transfer arm in a multiple station processing system without breaking system vacuum or incurring a long system downtime is desirable. Furthermore, an easy method of aligning and maintaining the alignment of the wafers during processing is also desired.

SUMMARY OF THE INVENTION

The present invention provides a method and apparatus for precisely calibrating the transfer arm of a multiple station wafer processing system without breaking vacuum and with a minimum of system downtime. The present invention also provides a simple system of determining and properly aligning the crystallographic orientation of the wafers before processing as well as monitoring the orientation of individual wafers during wafer transfer between processing stations.

In one aspect of the invention, a reticle is mounted in the wafer transfer arm and a locator mark is placed at a known position within each processing station. When the transfer arm is placed in a "calibration" position, the locator will be coincident with a known position on the reticle only if the transfer arm is properly calibrated. An image of the reticle with the superimposed locator mark is optically relayed to the user. If the transfer arm is not within calibration tolerances, the user can remotely adjust the transfer arm to bring it to within specifications. The system can also be automated so it routinely checks the calibration of the transfer arm and makes adjustments as necessary.

In a specific embodiment of the invention, the image of the reticle and the locator mark are relayed via fiber optics to a video camera assembly. The picture of the reticle and the superimposed locator mark are viewed in real time by a system operator who makes the necessary transfer arm adjustments. If the system is operating within calibration tolerances, the operator can make a permanent record of the system's performance. The data from the camera assembly can also be digitized and used to automatically adjust the position of the transfer arm.

In another aspect of the invention, the system includes a video camera which is used to observe the orientation markings on each wafer as it is removed from the system loading cassette and readied for processing. The system also includes means to rotate each wafer until its crystallographic orientation is properly positioned. This system can be used manually or it can be fully automated.

In another aspect of the invention, a wafer orientation monitoring system is mounted immediately adjacent to each individual processing station. Each monitoring system uses a video camera to observe the orientation markings on each wafer as the wafer is being transferred from the prior station to the present station. Since the wafer transfer operation does not have to be stopped during orientation monitoring, the overall system speed is not affected. In operation, as the wafer passes below the video camera an image of the wafer and hence its orientation markings are digitized. This digital image is then compared to data stored within the system. As long as the alignment of the wafer is such that its orientation is within the tolerance specification, the processing continues. If the wafer's orientation is incorrect, wafer identification data are noted so that the wafer can be subsequently rejected. In an alternate embodiment, the system is programmed to send the misoriented wafer back to the wafer orientation module for realignment.

A further understanding of the nature and advantages of the present invention may be realized by reference to the remaining portions of the specification and the drawings.

DESCRIPTION OF SPECIFIC EMBODIMENTS

Figure 1:
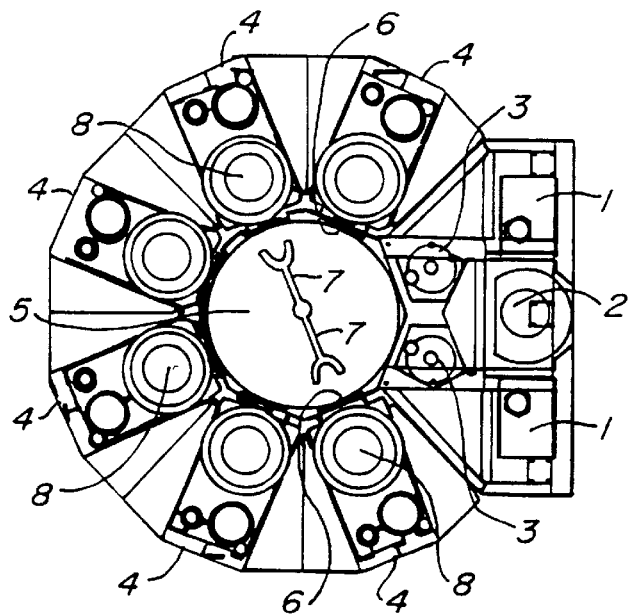
FIG. 1 is an illustration of a cross-sectional view of a conventional multiple station wafer processing system.
Figure 2:
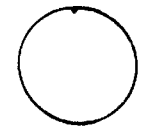
FIG. 2 is an illustration of a wafer which has a notch to indicate the wafer's crystallographic orientation.
Figure 3:
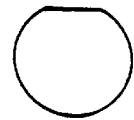
FIG. 3 is an illustration of a wafer which has a flat along the wafer's circumference to indicate its crystallographic orientation.

FIG. 1 is an illustration of a cross-sectional view of a conventional multiple station wafer processing system. Areas 1 are for loading and unloading wafer cassettes. If necessary, each individual wafer can be rotated at a rotation stage 2 in order to properly align the wafer's crystallographic orientation. In a conventional system, the orientation of the wafer is determined using a laser scanning system (not shown). The orientation of the wafer is determined on the basis of physical markings such as a notch (as illustrated in FIG. 2) or a flat (as illustrated in FIG. 3). After alignment, the wafer is transferred to a degassing station 3. From station 3, the wafer is transferred to any one of several processing stations 4. Each processing station 4 is separated from the transfer module 5 by a valve 6, thus allowing individual stations to operate at different pressures than that maintained in the transfer module. Wafers are transferred between stations with an extendable robotic transfer arm 7. The system has two arms 7 in order to increase wafer throughput speed. When properly calibrated, transfer arms 7 place wafers at the center of zone 8 within each station 4.

In the conventional system shown in FIG. 1, when transfer arms 7 require calibration the entire system must first be brought to atmospheric pressure. Next the covers must be removed from transfer module 5 as well as each of the processing stations 4. To perform the actual calibration, transfer arm 7 is extended into one of the processing stations 4 as if it were delivering a wafer. A system operator then visually inspects the position of transfer arm 7 in relation to zone 8. This inspection process is performed in each station 4 to determine how to properly adjust arm 7. After adjustment, the procedure is typically repeated at least one more time to insure that transfer arm 7 is now properly calibrated. After calibration, transfer module 5 as well as each processing station 4 must be reassembled and the entire system evacuated. The calibration process, from start to finish, generally takes between 16 and 20 hours.

Figure 4:
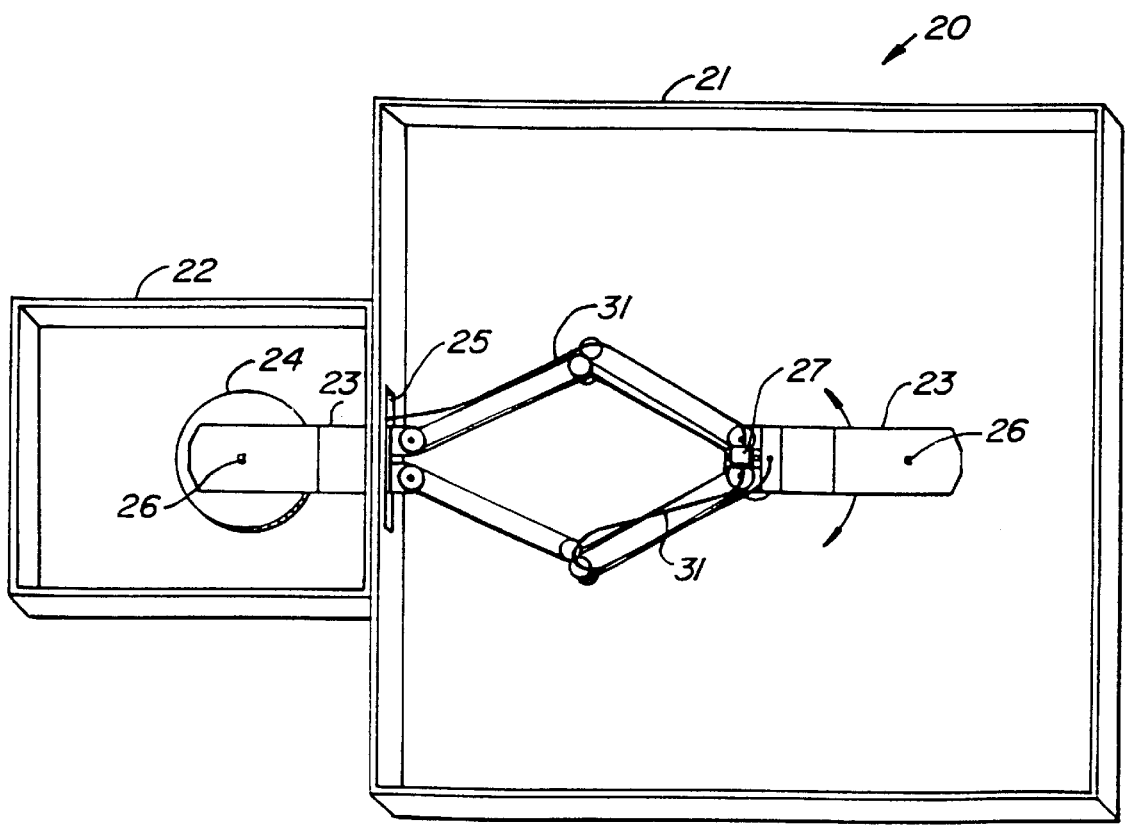
FIG. 4 is a simplified illustration of a processing system which includes one aspect of the invention.
Figure 5:
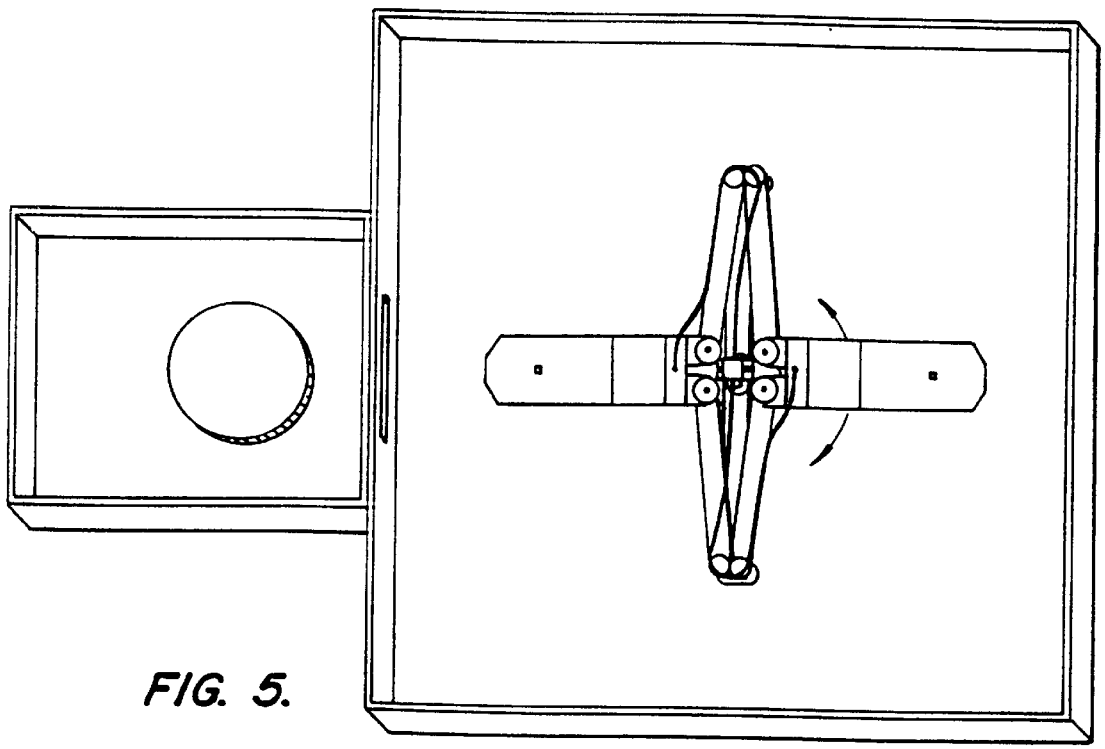
FIG. 5 is an illustration of the processing system shown in FIG. 4 with the transfer arms withdrawn from the processing station.

FIG. 4 is a simplified illustration of a processing system 20 which has been modified to include one aspect of the present invention. System 20 is comprised of a transfer module 21 and a processing station 22. Also shown is a pair of transfer arms 23, one in an extended position. In the extended position the transfer arm can either be delivering a wafer for processing or, as illustrated in FIG. 4, the arm can be empty in preparation for calibration. Contained within processing station 22 is a process pedestal 24. Under normal processing conditions a wafer is placed on pedestal 24 by arm 23, arm 23 is withdrawn from processing station 23 (as illustrated in FIG. 5), a valve (not shown) closes off station 22 at an access port 25, the system undergoes further evacuation and the wafer is processed (for example, coated with a specific material).

Figure 6:
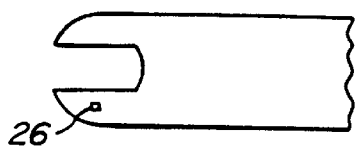
FIG. 6 is an illustration of a standard two prong transfer arm which has been modified to include the remote position sensing assembly of the present invention.

Located within transfer arm 23 is a remote position sensing assembly 26. A fiber optic cable 31 relays position information from assembly 26 to a center prism assembly 27. In the embodiment shown, assembly 26 is centered in the transfer arm such that it is coincident with the center of processing pedestal 24. However, assembly 26 can also be placed in one of the prongs of a standard transfer arm configuration as illustrated in FIG. 6, or elsewhere.

Figure 8:
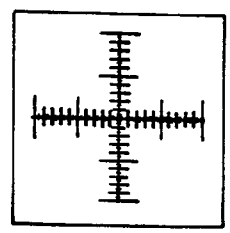
FIG. 8 is an illustration of a reticle suitable for use with the invention.
Figure 7:
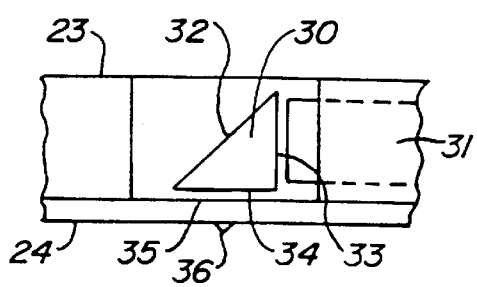
FIG. 7 is an illustration of the cross-section of a transfer arm highlighting the remote position sensing assembly.

FIG. 7 is an illustration of the cross-section of transfer arm 23 at the site of sensing assembly 26. In this embodiment, assembly 26 uses a prism 30 coupled to fiber optic cable 31 to direct an image of a portion of processing pedestal 24 to a remote viewer. For optimum efficiency, prism 30 has a reflective coating applied to the inside hypotenuse face 32 and anti-reflective coatings applied to right angle faces 33 and 34. Anti-reflective coatings are also applied to the endfaces of fiber optic cable 31. Prism 30 can be replaced with a simple mirror, although the prism is preferable due to its stability at elevated temperatures as well as the ease by which it can be mounted and maintained at the proper angle. A reticle 40, such as the one illustrated in FIG. 8, is either attached to a window 35 mounted to arm 23 beneath sensing assembly 26 or attached directly to prism face 34. In the preferred embodiment, reticle 40 is etched into window 35, reticle 40 containing calibrated cross hairs so that a user can accurately determine to what degree transfer arm 23 must be repositioned in order that it be properly aligned.

Figure 9:
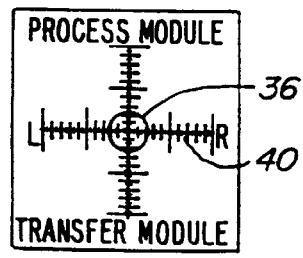
FIG. 9 is an illustration of the reticle of FIG. 8 with the locator mark superimposed at its center.

Process pedestal 24 contains a locator mark 36. Locator mark 36 is a dimple on the face of pedestal 24 in the preferred embodiment although it can be an etch mark or any other form of indicator mark which does not adversely affect pedestal 24's performance during normal wafer processing. When the system is properly aligned locator mark 36 lies directly beneath the center of reticle 40 when transfer arm 23 is in the calibration position, as illustrated in FIG. 9.

Figure 10:
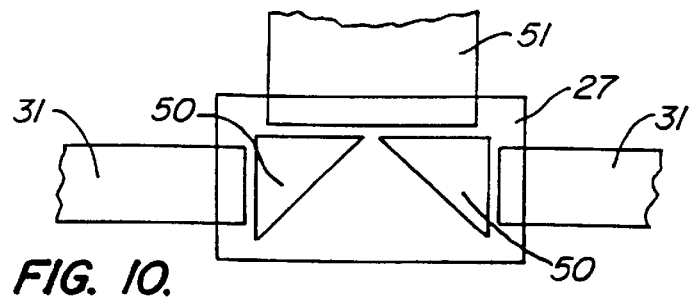
FIG. 10 is an illustration of the center prism assembly.

In the preferred embodiment, fiber optic cable 31 relays the image of reticle 40 with locator mark 36 superimposed on the image of reticle 40 to center prism assembly 27. As illustrated in FIG. 10, center prism assembly 27 contains two prisms 50 which couple the image from each fiber optic cable 31 to a single fiber optic rod 51. Prisms 50 have the same coatings as prism 30 and can similarly be replaced with simple turning mirrors. Rod 51 passes through the top surface of transfer module 21 (not shown). Although prism assembly 27 rotates with the rotation of transfer arms 23, rod 51 remains fixed with respect to transfer module 21.

Figure 11:
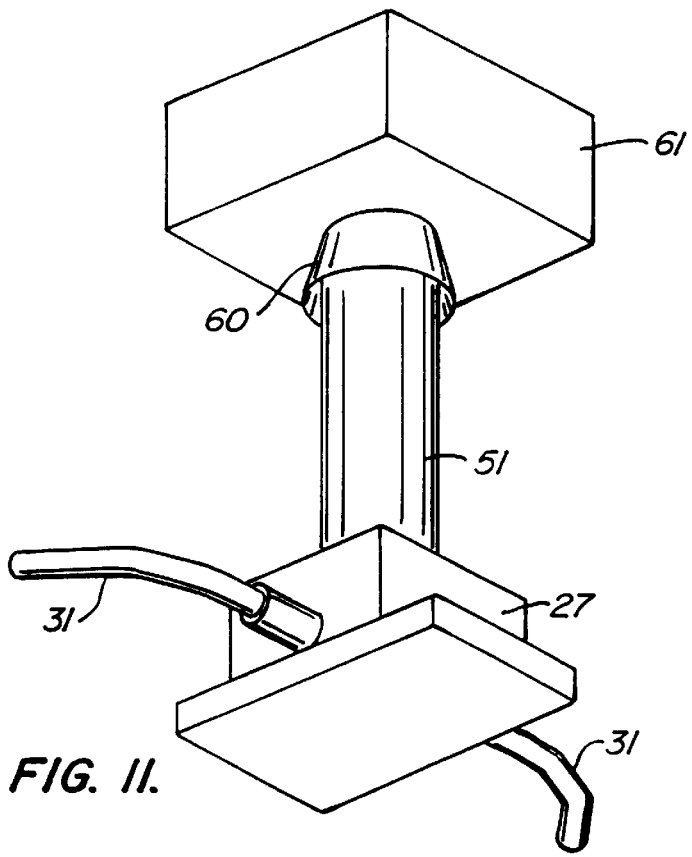
FIG. 11 is an illustration of the camera assembly used with the remote position sensing assembly.

FIG. 11 is an illustration of the camera assembly. After passing through the top surface of transfer module 21 (not shown), fiber optic rod 51 is coupled to a lens assembly 60 of a video camera 61. The video camera records the images of reticles 40 and associated locator marks 36 for each transfer arm 23.

In the preferred embodiment, the calibration data received by camera assembly 61 are digitized and sent to a CRT screen for review by the system operator. Based upon this information, the system operator remotely adjusts the position of transfer arms 23 until they are correctly aligned. In an alternate embodiment, the digitized data from camera assembly 61 is used by a computer to perform an automatic adjustment of the transfer arms' positions.

In an alternate embodiment, fiber optic cables 31 and fiber optic rod 51 are replaced with a series of relay mirrors. The image passes through a window mounted in the top surface of transfer module 21 where it is recorded by camera 61.

Figure 12:
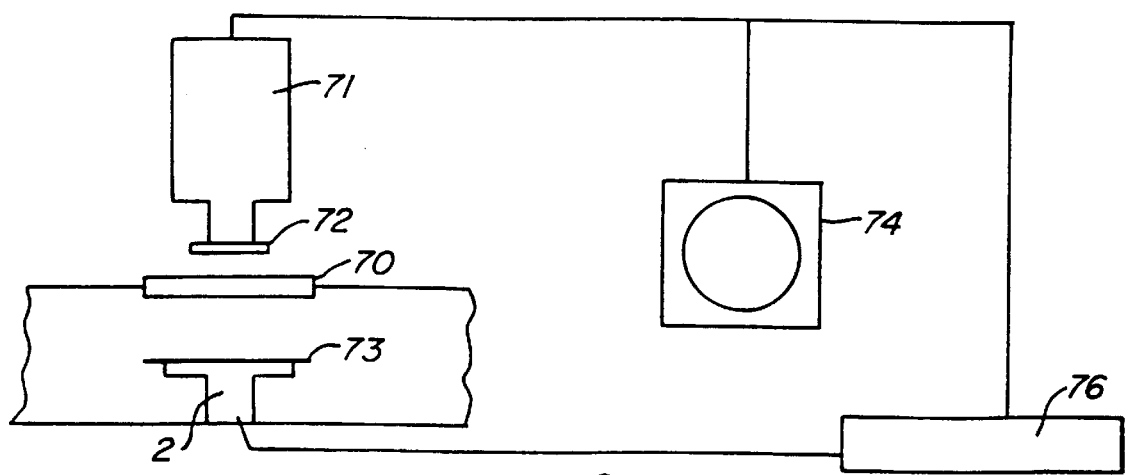
FIG. 12 is an illustration of the wafer orienting aspect of the invention.
Figure 13:
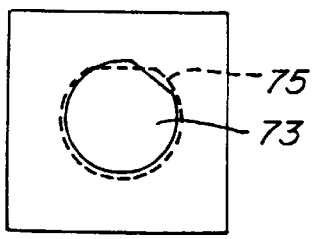
FIG. 13 is an illustration of the screen of a CRT display showing an improperly oriented wafer and the outline of a correctly oriented wafer.

In another aspect of the invention shown in FIG. 12, a window 70 is mounted in the top surface of the multiple wafer processing system directly above rotation stage 2. Mounted directly above this window is a video camera 71 with a wide angle lens 72. After a wafer 73 is placed on rotation stage 2, an image of the wafer is recorded by camera 7i, digitized, and sent to a CRT 74. In one embodiment, superimposed on the image of wafer 73 is an image of the outline of a correctly aligned wafer. A user can then rotate stage 2 until the image of wafer 73 is coincident with the outline of the correctly aligned wafer. FIG. 13 is an illustration of CRT 74's screen with an image of wafer 73 as well as an outline of a correctly aligned wafer 75.

In another embodiment of the invention, the digitized data from camera 71 is sent to a computer which determines whether wafer 73 is correctly aligned and if not, by how much it is out of alignment. Computer 76 then rotates stage 2 until wafer 73 should be properly aligned, and then rechecks the orientation of wafer 73 to insure that it is within alignment tolerances. Comparison algorithms suitable for this task are well known by those skilled in the art.

Figure 14:
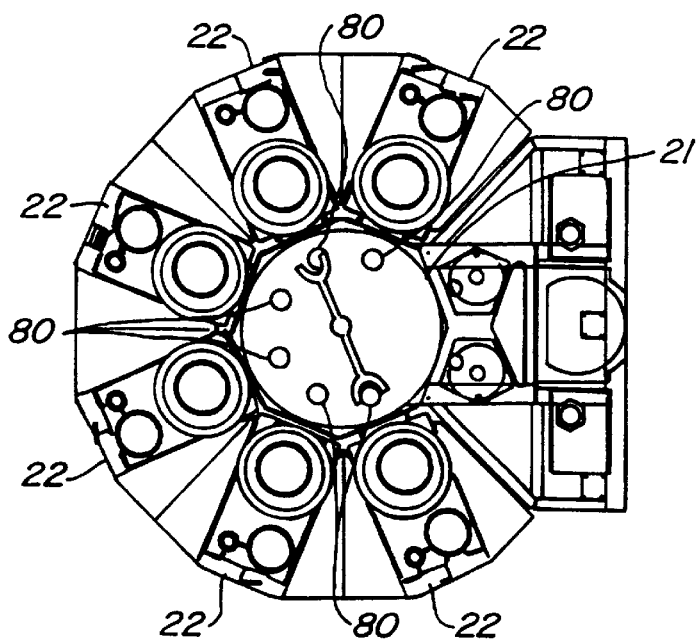
FIG. 14 is an illustration of a multiple station wafer processing system with a plurality of windows positioned immediately adjacent to the entrance of each processing station.
Figure 15:
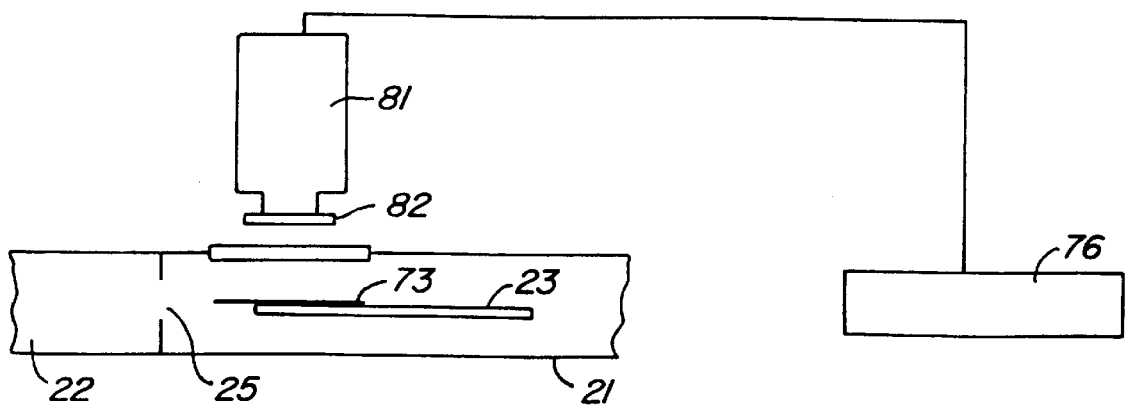
FIG. 15 is an illustration of a cross-sectional view of a wafer orientation monitoring system mounted immediately adjacent to each processing station.

In another aspect of the invention illustrated in FIG. 14, a plurality of windows 80 are placed in the top surface of transfer module 21, each window 80 placed immediately adjacent to the entrance of each processing station 22. FIG. 15 is a cross-sectional view of this aspect of the invention.

Mounted directly above each window 80 is a video camera 81 with a wide angle lens 82. As transfer arm 23 moves a wafer 73 into processing station 22 through access port 25, an image of wafer 73 is recorded and digitized by camera 81 and sent to computer 76. Computer 76 determines whether or not wafer 73 is correctly aligned as it is entering station 22. In the preferred embodiment, if wafer 73 is not within the designated orientation tolerances, computer 76 records the wafer's identification data so that it may be easily rejected at a later time. In an alternate embodiment, computer 76 temporarily stops the processing of wafer 73 and transfers it back to stage 2 for realignment. After the wafer's alignment is corrected, the processing of this wafer is resumed.

As will be understood by those familiar with the art, the present invention may be embodied in other specific forms or used within different wafer processing systems, such as for ion implantation or sputter coating of materials, without departing from the spirit or essential characteristics thereof. Accordingly, disclosure of the preferred embodiment of the invention is intended to be illustrative, but not limiting, of the scope of the invention which is set forth in the following claims.

We claim:

1. A method of inspecting the orientation of a wafer in a sealable semiconductor processing system, said method comprising the steps of:

defining a desired wafer orientation;

detecting the orientation of said wafer while said wafer is transferred from a first location to a second location in said sealable semiconductor processing system while said system is sealed by imaging said wafer using an optical imaging assembly optically coupled to said wafer; and determining whether the orientation of said wafer matches said desired wafer orientation.

2. The method of claim 1, further comprising the step of disposing at least a portion of said optical imaging assembly externally to said sealable semiconductor processing system.

3. The method of claim 1, wherein said optical imaging assembly preferably comprises at least one video camera.

4. The method of claim 1, said imaging step further comprising the step of transmitting the image of said wafer to a display for representing the orientation of said wafer.

5. The method of claim 1, said imaging step further comprising the steps of transmitting the image of said wafer to a computer and determining whether the orientation of said wafer matches said desired wafer orientation by utilizing said computer.

6. The method of claim 1, further comprising the step of disposing said optical imaging assembly proximate to at least one viewing site for imaging said wafer while said wafer is transferred from said first location to said second location.

7. The method of claim 6, wherein said at least one viewing site is located proximate to said second location.

8. The method of claim 1, wherein the step of determining further comprises the step of rejecting said wafer if the orientation of said wafer does not match said desired wafer orientation.

9. The method of claim 1, wherein the step of determining further comprises the step of realigning the orientation of said wafer if said orientation does not match said desired wafer orientation.

10. A wafer orientation inspection system for inspecting the orientation of a wafer located within a sealable semiconductor processing system, said orientation inspection system comprising:

an optical imaging assembly optically coupled to said wafer for detecting the orientation of said wafer while said wafer is transferred from a first location to a second location in said sealable semiconductor processing system while said semiconductor processing system is sealed; and an orientation determining system for determining whether the orientation of said wafer matches a desired wafer orientation.

11. The wafer orientation inspection system of claim 10, wherein at least a portion of said optical imaging assembly is disposed externally to said sealable semiconductor processing system.

12. The wafer orientation inspection system of claim 10, wherein said optical imaging assembly comprises at least one video camera.

13. The wafer orientation inspection system of claim 10, wherein said optical imaging assembly further comprises at least one fiber optic cable.

14. The wafer orientation inspection system of claim 10, wherein said optical imaging assembly further comprises at least one fiber optic rod.

15. The wafer orientation inspection system of claim 10, wherein said optical imaging assembly further comprises at least one mirror.

16. The wafer orientation inspection system of claim 10, wherein said optical imaging assembly further comprises at least one prism.

17. The wafer orientation inspection system of claim 10, wherein said optical imaging assembly is disposed proximate to at least one viewing site for imaging said wafer while said wafer is transferred from said first location to said second location.

18. The wafer orientation inspection system of claim 17, wherein said at least one viewing site is located proximate to said second location.

19. The wafer orientation inspection system of claim 10, further comprising a display coupled to said orientation sensing system, said display representing the orientation of said wafer.

20. The wafer orientation inspection system of claim 10, wherein the orientation determining system comprises a computer.

21. The wafer orientation inspection system of claim 10, wherein the orientation determining system rejects said wafer if the orientation of said wafer does not match said desired wafer orientation.

22. The wafer orientation inspection system of claim 10, wherein the orientation determining system realigns the orientation of said wafer if said orientation does not match said desired wafer orientation.

23. The wafer orientation inspection system of claim 10, wherein the semiconductor processing system is a device to implant ions into said wafer.

24. The wafer orientation inspection system of claim 10, wherein the semiconductor processing system is a device to sputter coat said wafer.

25. An apparatus for inspecting the orientation of a wafer in a sealable semiconductor processing system, said apparatus comprising:

means for defining a desired wafer orientation;

means for detecting the orientation of said wafer while said wafer is transferred from a first location to a second location in said sealable semiconductor processing system while said system is sealed by imaging said wafer using an optical imaging assembly optically coupled to said wafer; and means for determining whether the orientation of said wafer matches said desired wafer orientation.

* * * * *